(12) United States Patent
Tojo (10) Patent No.: US 10,153,448 B2
(45) Date of Patent: Dec. 11, 2018

(54) DISPLAY DEVICE AND METHOD OF MANUFACTURING DISPLAY DEVICE

(71) Applicant: Japan Display Inc., Tokyo (JP)

(72) Inventor: Toshio Tojo, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/616,112

(22) Filed: Jun. 7, 2017

(65) Prior Publication Data

US 2018/0006256 A1    Jan. 4, 2018

(30) Foreign Application Priority Data

Jun. 29, 2016    (JP) .................................. 2016-128798

(51) Int. Cl.

| | |
|---|---|
| *H01L 51/52* | (2006.01) |
| *H01L 51/50* | (2006.01) |
| *G09G 3/3208* | (2016.01) |
| *H01L 27/28* | (2006.01) |
| *H05B 33/06* | (2006.01) |
| *H05B 33/14* | (2006.01) |
| *H01L 27/32* | (2006.01) |

(52) U.S. Cl.
CPC ........... *H01L 51/50* (2013.01); *G09G 3/3208* (2013.01); *H01L 27/28* (2013.01); *H01L 27/3211* (2013.01); *H01L 27/3246* (2013.01); *H01L 51/5268* (2013.01); *H05B 33/06* (2013.01); *H05B 33/145* (2013.01); *G09G 2300/0809* (2013.01); *H01L 27/3286* (2013.01); *H01L 2251/5315* (2013.01)

(58) Field of Classification Search
CPC ............. H01L 27/3246; H01L 27/3295; H01L 27/3283; H01L 51/5262–51/5275
See application file for complete search history.

(56) References Cited

U.S. PATENT DOCUMENTS

| | | | |
|---|---|---|---|
| 8,772,762 B2 * | 7/2014 | Kaneta ................ | H01L 51/5206 257/13 |
| 2005/0270279 A1 * | 12/2005 | Giraldo ............... | H01L 27/3246 345/204 |
| 2014/0175469 A1 * | 6/2014 | Dozen .................. | H01L 33/005 257/89 |
| 2015/0060826 A1 * | 3/2015 | Matsumoto ......... | H01L 27/3246 257/40 |

FOREIGN PATENT DOCUMENTS

| | | | |
|---|---|---|---|
| JP | 2004-335276 A | 11/2004 | |
| JP | 2007311235 A | * 11/2007 | |
| JP | 2008046306 A | * 2/2008 | |
| WO | WO 2010030591 A2 | * 3/2010 | ......... H01L 27/3246 |

* cited by examiner

*Primary Examiner* — Mariceli Santiago
(74) *Attorney, Agent, or Firm* — Typha IP LLC (57) ABSTRACT

A display device is provided including a first electrodes arranged in a matrix shape above an insulation surface, a bank covering an end part of the first electrode and having an opening part exposing an upper surface of the first electrode, an organic layer covering the opening part and including a light emitting layer, and a second electrode covering the bank and the organic layer, wherein the bank has an upper surface part and an inclined part between the upper surface part and an opening in the bank, and a surface of the inclined part has a plurality of concave and convex parts.

8 Claims, 7 Drawing Sheets

DISPLAY DEVICE AND METHOD OF MANUFACTURING DISPLAY DEVICE

CROSS REFERENCE TO RELATED APPLICATIONS

This application is based upon and claims the benefit of priority from the prior Japanese Patent Application No. 2016-128798, filed on Jun. 29, 2016, the entire contents of which are incorporated herein by reference.

FIELD

The present invention is related to a display device and a method of manufacturing the display device. An embodiment of the present invention is related to a structure of a pixel in a display device.

BACKGROUND

An organic electroluminescence (referred to herein as organic EL) display device is arranged with a light emitting element in each pixel and displays an image by individually controlling emitted light. A light emitting element has a structure in which a layer including an organic EL material (referred to herein as [organic layer]) is sandwiched between a pair of electrodes distinguished as an anode and a cathode. When electrons are injected from the cathode to the organic layer and holes are injected from the anode to the organic layer, the electrons and holes recombine, thereby the discharged excess energy excites light emitting molecules within the organic layer which then emit light by de-excitation.

The anode within each light emitting element in an organic EL display device is arranged as a pixel electrode for each pixel and the cathode is arranged as a common electrode applied with a common voltage across a plurality of pixels. The organic EL display device controls emitted light of a pixel by applying the voltage of a pixel electrode to each pixel with respect to the voltage of this common electrode.

Here, although it is sufficient that a larger voltage is applied in order to obtain a better luminance, this results in shortening the life of a light emitting element. On the other hand, only about 20% of the light emitted by an organic layer is utilized. The remaining 80% is wave-guided through layers or within a substrate while repeatedly being totally reflected due to differences in interlayer refractive indexes, is attenuated and absorbed within a layer. As a result, various efforts are being made in order to obtain a high light extraction efficiency.

For example, an organic EL display device is disclosed in Japanese Laid Open Patent Publication 2004-335276 in which concave convex parts are formed in the surface of an insulation film formed on a lower layer of a pixel electrode. In an organic EL display device configured in this way, light which is output from an organic layer is emitted after passing through a pixel electrode and insulation film. At this time, the concave convex parts formed between the pixel electrode and insulation film prevent emitted light from being reflected by an interface surface thereof. However, the organic EL display device disclosed in Japanese Laid Open Patent Publication No. 2004-335276 only considers the extraction efficiency of light in a front surface direction in an organic layer flat part.

SUMMARY

According to one embodiment of the present invention, a display device is provided including a first electrode arranged in a matrix shape above an insulation surface, a bank covering an end part of the first electrode and having an opening part exposing an upper surface of the first electrode, an organic layer covering the opening part and including a light emitting layer, and a second electrode covering the bank and the organic layer, wherein the bank has an upper surface part and an inclined part between the upper surface part and an opening in the bank, and a surface of the inclined part has a plurality of concave and convex parts.

According to one embodiment of the present invention, a method of manufacturing a display device is provided including forming a first electrode above an insulation surface, coating a photosensitive organic resin material above the first electrode, exposing the photosensitive organic resin material to a monochromatic light having a wavelength in a range from 300 nm to 500 nm, forming a bank covering an end part of the first electrode and having an opening part exposing an upper surface of the first electrode by developing the photosensitive organic resin material, baking, forming an organic layer including a light emitting layer to cover the opening part, and forming a second electrode to cover the bank and the organic layer, wherein in the exposure step, the plurality of concave and convex parts are formed in a film thickness direction of the bank by weakening and strengthening the exposure level of the photosensitive organic resin material in a layer direction using a standing wave by an incident wave and reflective wave of the monochromatic light.

DESCRIPTION OF EMBODIMENTS

The embodiments of the present invention are explained below while referring to the diagrams. However, it is possible to perform the present invention using various different forms, and the present invention should not be limited to the content described in the embodiments exemplified herein. Although the width, thickness and shape of each component are shown schematically compared to their actual form in order to better clarify explanation, the drawings are merely an example and should not limit an interpretation of the present invention. In addition, in the specification and each drawing, the same reference symbols are attached to similar elements and elements that have been mentioned in previous drawings, and therefore a detailed explanation may be omitted where appropriate.

In the present specification, in the case where certain parts or regions are given as [above (or below)] other parts or regions, as long as there is no particular limitation, these include parts which are not only directly above (or directly below) other parts or regions but also in an upper direction (or lower direction). That is, in the case where certain parts or regions are given as [above (or below)] other parts or regions, other structural elements may be included between other parts or regions in an upper direction (or lower direction).

<Structure of a Display Device>

Figure 1:
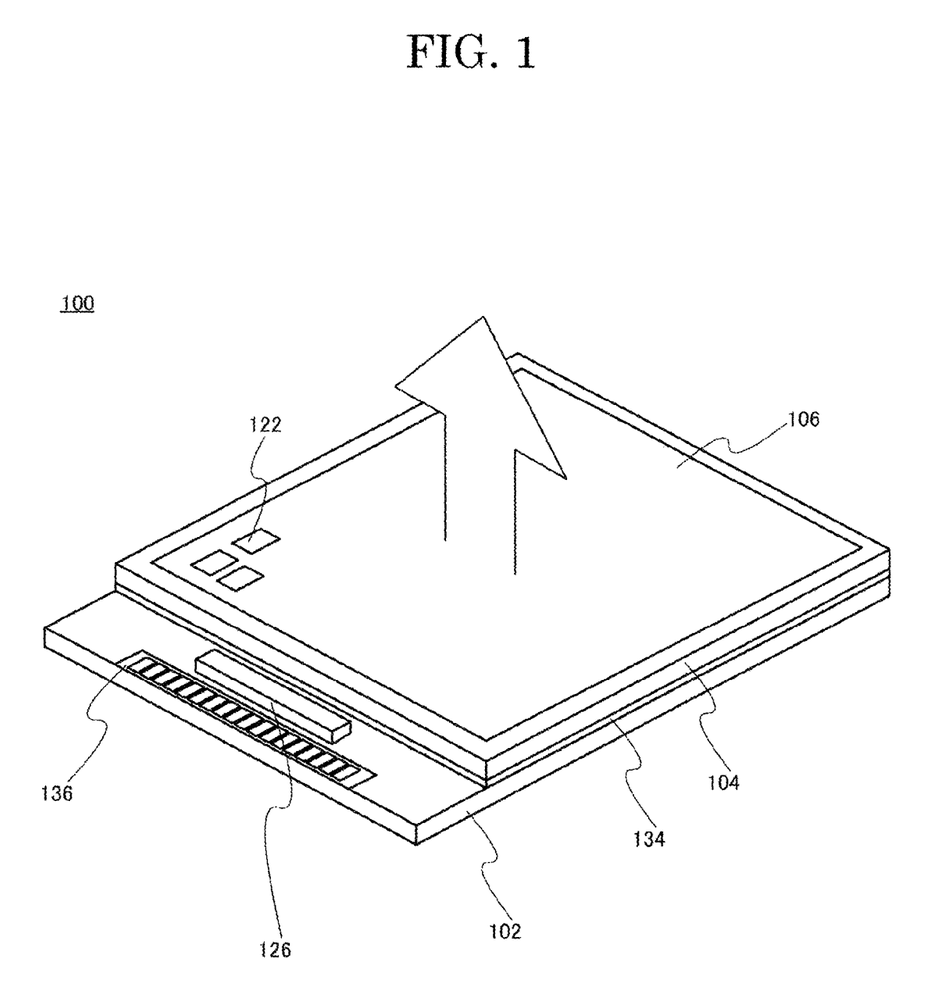
FIG. 1 is a perspective view diagram showing a structure of a display device related to one embodiment of the present invention.
Figure 2:
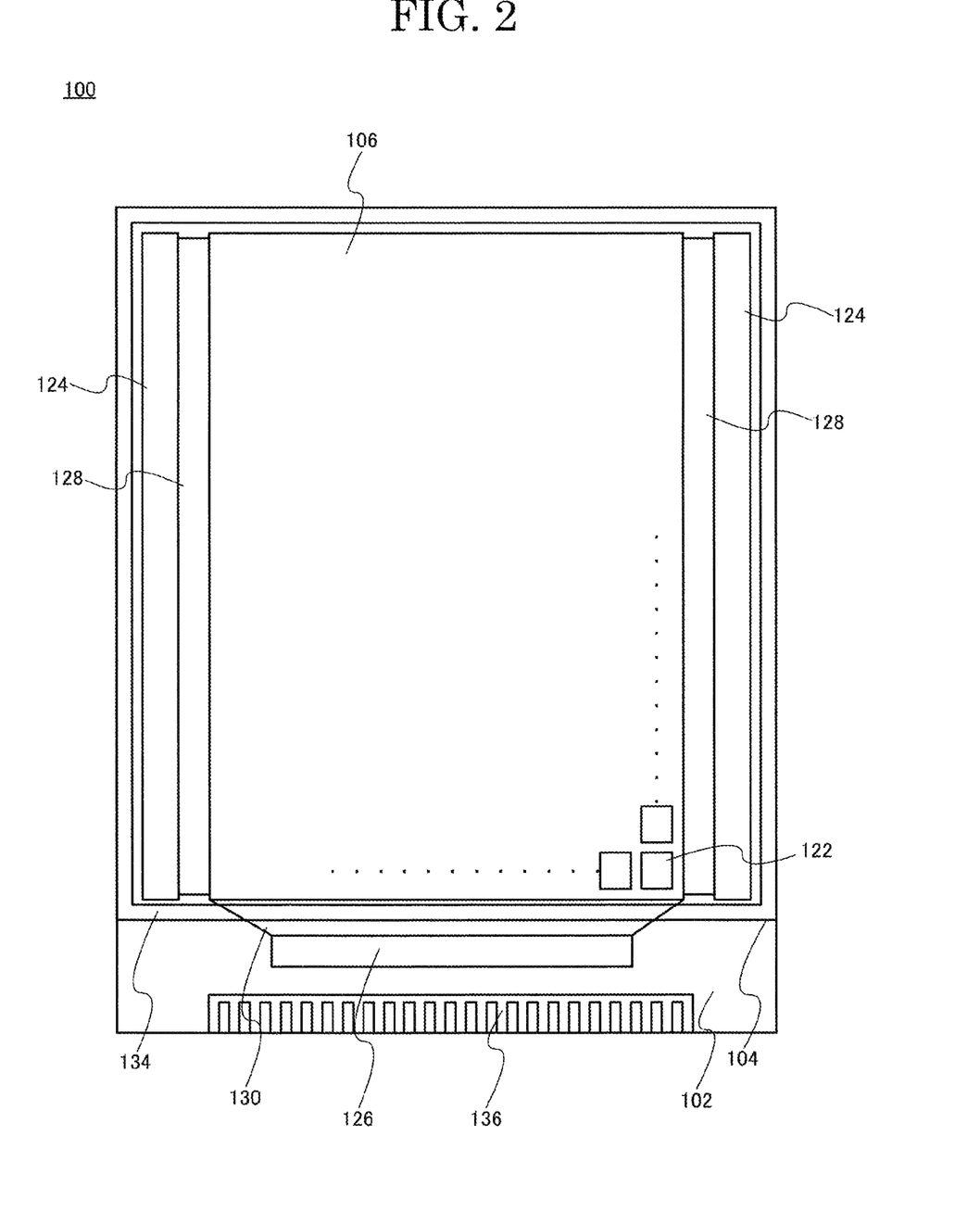
FIG. 2 is a planar view diagram showing a structure of a display device related to one embodiment of the present invention.

FIG. 1 is a perspective view diagram showing an approximate structure of a display device 100 related to the present embodiment. FIG. 2 is a planar view diagram showing an approximate structure of the display device 100 related to the present embodiment. An approximate structure of the display device 100 related to the present embodiment is explained while referring to FIG. 1 and FIG. 2.

The display device 100 is arranged with a pixel region 106 on a first substrate 102. The pixel region 106 is formed by arranging a plurality of pixels 122. A second substrate 104 is arranged as a sealing material on the upper surface of the pixel region 106. The second substrate 104 is fixed to the first substrate 102 by a sealing member 134 which encloses the pixel region 106. A pixel region 106 formed on the first substrate 102 is sealed so that it is not exposed to air by the second substrate 104 which is a sealing material and the sealing member 134. There is no particular limitation to the sealing method of the pixel region 106, and a direct passivation film may also be formed to cover a pixel region 106 arranged on the first substrate 102 without arranging a second substrate 104.

A terminal region 136 is arranged at one end of the first substrate 102. The terminal region 136 is arranged on the outer side of the second substrate 104. A connection terminal of the terminal region 136 forms a connection point with a wiring substrate for connecting devices which output an image signal or a power source and the display device 100. A first drive circuit 124 and second drive circuit 126 which output an image signal input from the terminal region 136 to the pixel region 106 are arranged on the first substrate 102.

The pixel region 106 and the first drive circuit 124 are connected by wirings not shown in the diagram. The pixel region 106 and the second drive circuit 126 are also connected by wirings not shown in the diagram. In addition to a pixel 122, the pixel region 106 is arranged with wiring called a scanning signal line and image signal line. Each pixel 122 of a pixel region 106 is connected with the first drive circuit 124 and second drive circuit 126 by these wiring. For example, the first drive circuit 124 is a drive circuit which outputs a scanning signal to a pixel region 106 and the second drive circuit 126 is a drive circuit which outputs an image signal to a pixel region 106. FIG. 2 shows a form in which a first wiring extending region 128 is provided between a pixel region 106 and the first drive circuit 124, and a second wiring extending region 130 is provided between a pixel region 106 and the second drive circuit 126.

Figure 3:
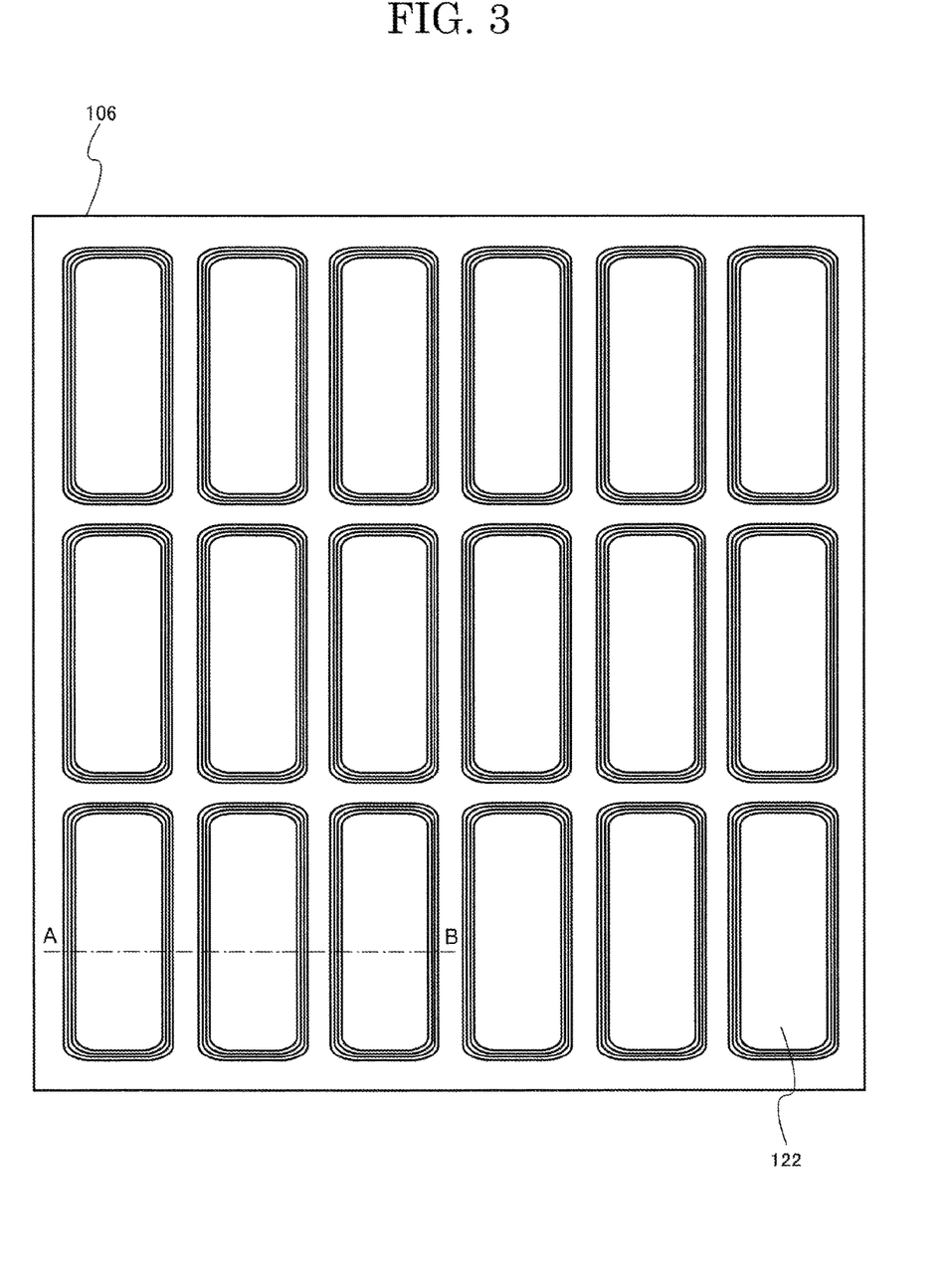
FIG. 3 is a planar view diagram showing a structure of a display device related to one embodiment of the present invention.
Figure 4:
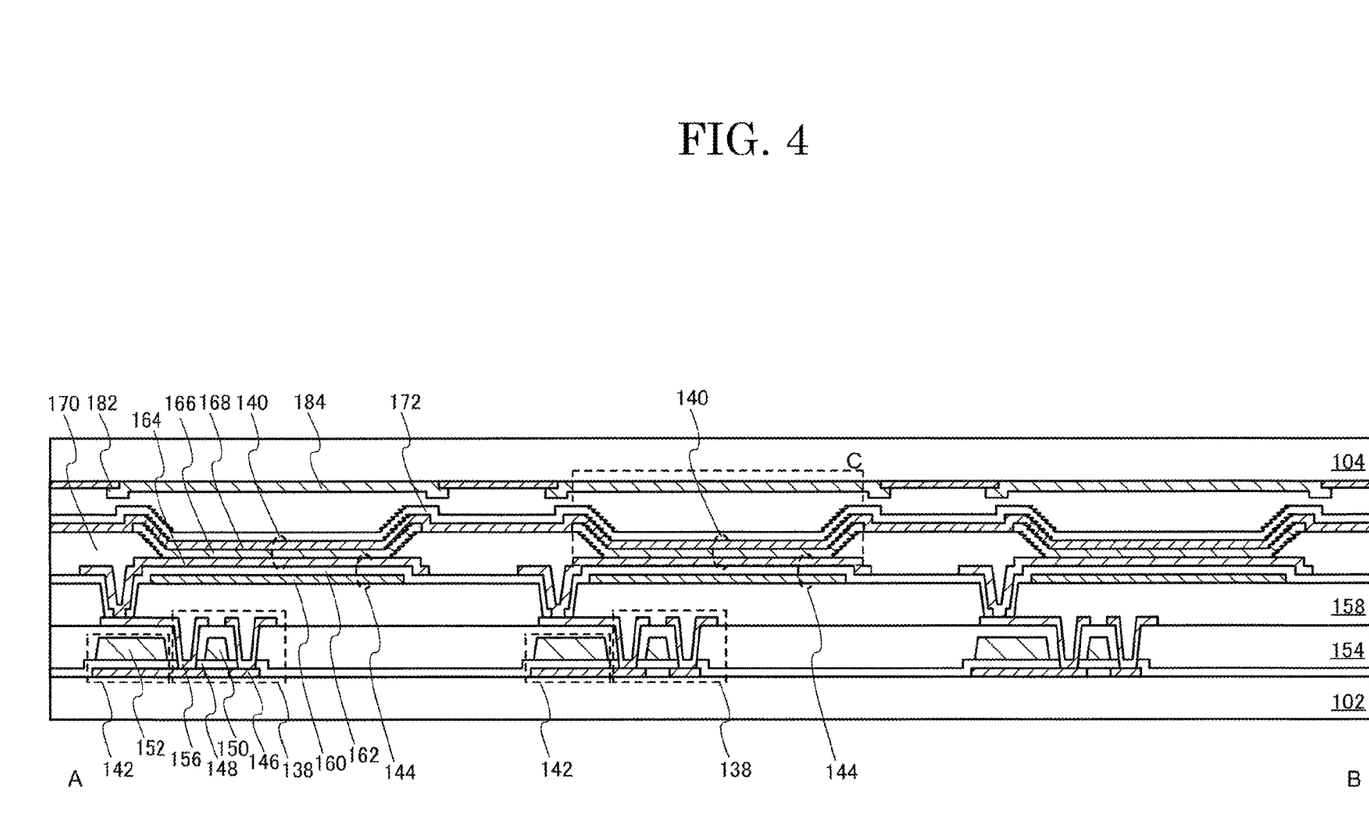
FIG. 4 is a cross-sectional diagram showing a structure of a display device related to one embodiment of the present invention.

FIG. 3 is a planar view diagram showing a structure of a pixel region 106 related to the present embodiment. FIG. 4 is a cross-sectional diagram showing a structure of a pixel region 106 related to the present embodiment. The structure of a pixel region 106 related to the present embodiment is explained while referring to FIG. 3 and FIG. 4.

As is shown in FIG. 3, a pixel region 106 is formed by a plurality of pixels 122 arranged in a matrix shape. FIG. 4 is a cross-sectional schematic diagram along the line A-B shown in FIG. 3. A pixel 122 includes a circuit element layer. A circuit element layer in the present embodiment has a multi-layer structure including a semiconductor layer 146, a gate insulation layer 148, a gate electrode 150, a first capacitor electrode 152, a first insulation layer 154, a source/drain electrode 156, a second insulation layer 158, a second capacitor electrode 160, a third insulation layer 162, a pixel electrode (a first electrode) 164, an organic layer 166, an opposing electrode (a second electrode) 168 and a bank layer 170.

Each of the plurality of pixels 122 in a pixel region 106 includes a transistor 138, a light emitting element 140, a first capacitor element 142 and a second capacitor element 144. The light emitting element 140 is connected with the transistor 138. The transistor 138 controls emitted light of the light emitting element 140. The first capacitor element 142 stores a gate voltage of the transistor 138 and the second capacitor element 144 is arranged in order to adjust the amount of current flowing to the light emitting element 140.

As is shown in FIG. 4, each of the plurality of pixels 122 includes a transistor 138 for each pixel and the transistor 138 is arranged in a matrix shape in the pixel region 106. The transistor 138 has a structure in which the semiconductor layer 146, gate insulation layer 148 and gate electrode 150 are stacked. The semiconductor layer 146 is formed by amorphous or polycrystalline silicon or by an oxide semiconductor and the like. The source/drain electrode 156 is arranged in an upper layer of the gate electrode 150 via the first insulation layer 154. The second insulation layer 158 as a levelling layer is arranged in an upper layer of the source/drain electrode 156. In addition, the light emitting element 140 is arranged on an upper surface of the second insulation layer 158. The second insulation layer 158 has a roughly flat surface by burying depressions and protrusions of the first insulation layer 154 that accompany the shape of a contact hole arranged in the source/drain electrode 156 and first insulation layer 154, and the gate electrode 150 and semiconductor layer 146. The second insulation layer 158 may also have a flat surface formed by performing an etching process and/or a chemical mechanical polishing process of a surface of an inorganic insulation layer, or a leveled flat surface obtained by coating or depositing a composition including a precursor such as acrylic or polyimide and the like.

The first capacitor element 142 is formed in a region in which the semiconductor layer 146 and first capacitor electrode 152 overlap with the gate insulation layer 146 as a dielectric layer, and in a region sandwiched by the source/drain electrode 156 and the first capacitor electrode 152 with the first insulation layer 154 as a dielectric layer.

Each of the plurality of pixels 122 has a light emitting element 140 for each pixel and the light emitting element 140 is arranged in a matrix shape in the pixel region 106. The light emitting element 140 has a structure in which the pixel electrode 164 electrically connected with the transistor 138, the organic layer 166 and opposing electrode 168 are stacked. The light emitting element 140 is a 2 terminal element and light emitted by the organic layer 166 including a light emitting layer is controlled by controlling the value of a current flowing between the pixel electrode 164 and opposing electrode 168.

The pixel electrode 164 is arranged in each pixel above the second insulation layer 158. The pixel electrode 164 is arranged in an upper layer of the source/drain electrode 156 via the second insulation layer 158. In addition, a bank layer 170 is arranged on an upper surface of the pixel electrode 164 so as to cover a periphery edge part of the pixel electrode 164 and expose an inner region of the pixel electrode 164. In other words, the bank layer 170 is arranged in the upper surface of the pixel electrode 164 and covers an end part and also includes an opening part which exposes an upper surface of the pixel electrode 164. Furthermore, the bank layer 170 buries a contact hole arranged in the pixel electrode 164 and second insulation layer 158. By arranging the bank layer 170 formed by an insulation material, it is possible to prevent the opposing electrode 168 and pixel electrode 164 from short-circuiting at an end part of the pixel electrode 164.

Furthermore, it is possible to securely insulate adjacent pixels 122. The organic layer 166 is arranged on an upper surface of the bank layer 170 to cover an opening part. The organic layer 166 is arranged in each pixel on the upper surface of the pixel electrode 164 and the bank layer 170. The opposing electrode 168 is arranged from the upper surface of the organic layer 166 to cover an upper surface of the bank layer 170 and is arranged as a common electrode bridging a plurality of pixels 122.

Figure 5:
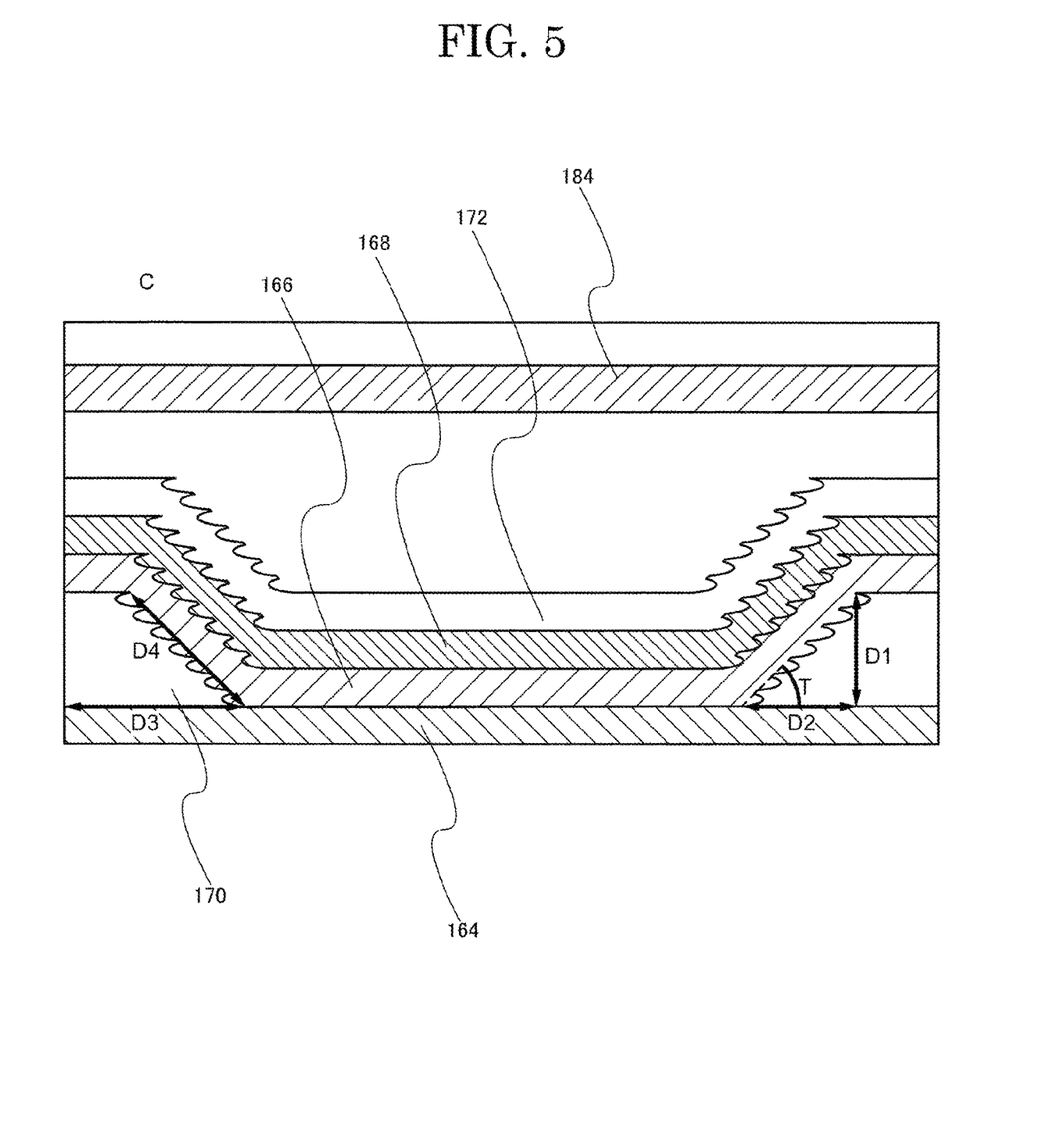
FIG. 5 is a cross-sectional diagram showing a structure of a display device related to one embodiment of the present invention.

FIG. 5 is an enlarged cross-sectional diagram of a C region around the light emitting element 140 shown in FIG. 4. The bank layer 170 has an upper surface part parallel with an upper surface of the pixel electrode 164 (or a bottom part of the bank layer 170) and a taper structure in an inclined part D4 between the upper surface part and an opening in the bank. An angle (taper angle, T) formed by the inclined part and bottom part of the bank layer 170 is 45° or more. That is, when a film thickness of the bank layer 170 is given as D1 and the width of the inclined part of the bank layer 170 in a plane direction is given as D2, D2 is preferred to be smaller than D1. By adopting such a structure, it can sufficiently ensure an opening part which exposes an upper surface of the pixel electrode 164 and more efficiently extract light emitted from the organic layer 166 to a front direction of the display device.

The inclined part of the bank layer 170 is arranged above the pixel electrode 164. In other words, an end part of the pixel electrode 164 is arranged at least further to the outer side than the inclined part of the bank layer 170 in a planar view. That is, when a film thickness of the bank layer 170 is given as D1 and the width from the opening in the bank (inclined bottom end part of the bank layer 170) to the end part of the pixel electrode 164 is given as D3, D3 is preferred to be bigger than D1. By adopting such a structure, the pixel electrode 164 is arranged in an opening part of a mask 171 when forming the bank layer 170 described later. Using monochromatic light, it becomes possible to form a concave-convex structure at the inclined part in the bank layer 170. That is, the bank layer 170 above the pixel electrode 164 is exposed by the monochromatic light. The monochromatic light is reflected from the pixel electrode 164. By interference between the incident wave (the monochromatic light) and the reflective wave from the pixel electrode 164, a standing wave can be generated. Thus, exposure intensity is different in a position of the bank layer 17. In other words, the concave-convex structure is formed on the surface of the inclined part of the bank layer 170 by changing the exposure intensity of this standing wave.

FIG. 5 is an enlarged cross-sectional diagram of a C region around the light emitting element 140 shown in FIG. 4. A concave-convex structure is arranged on the surface of the inclined part of the bank layer 170. The bottom part and the upper part of the bank layer 170 have a flat structure. The concave-convex structure is formed on the inclined part and it can be seen as a cyclical wave shape in a planar view. In other words, the concave-convex structure has a banded shape parallel to a film thickness direction. The cycle of the concave-convex structure is constant in a film thickness direction in a range from 150 nm to 250 nm. In other words, the inclined part of the bank layer 170 has from 4 to 6.7 concave-convex structures per 1 μm in a film thickness direction. In this embodiment, the depth of the concave in the concave-convex structure is formed smaller towards the direction of the bottom part, however, the structure is not limited only to this case.

By providing the bottom part of the bank layer 170 with a flat structure, among the light emitted by the organic layer 166, light heading towards the front surface of the display device resonates (cavitates) between the pixel electrode 164 (or second capacitor electrode 160) arranged with a function of a reflective plate and the opposing electrode 168 formed by a transparent conductive film, and it can more efficiently extract the light. By providing the inclined part of the bank layer 170 with a concave-convex structure, among the light emitted by the organic layer 166, light which is passes within the layers without being extracted to the front direction of the display device causes irregular reflection by the concave-convex structure. As a result, reflected light whose incident angle is smaller than a critical angle increases, and it is able to even more efficiently extract light to the front direction of the display device.

The organic layer 166, opposing electrode 168 and sealing layer 172 reflect a shape of the concave-convex structure in the inclined part of the bank layer 170. In other words, the organic layer 166, opposing electrode 168 and sealing layer 172 are arranged with the concave-convex structure above the inclined part. However, the present invention is not limited thereto and at least a part of the concave-convex structure may also be buried in the inclined part of the bank layer 170 when forming the organic layer 166, opposing electrode 168 and sealing layer 172. The organic layer 166, opposing electrode 168 and sealing layer 172 in the opening bottom part of the bank layer 170 have a flat structure.

A material of the bank layer 170 is a photosensitive organic resin. A photosensitive acrylic resin or photosensitive polyimide resin and the like are used as the photosensitive organic resin material.

The organic layer 166 is a layer including a light emitting material such as an organic luminescence material. The organic layer 166 includes a low molecular or high molecular organic material. When a low molecular organic material is used, in addition to a light emitting layer including an organic material with light emitting properties, the organic layer 166 may be structured including a hole injection layer, electron injection layer, a hole transport layer, and electron transport layer in order to sandwich the light emitting layer. Not shown in the diagram, for example the organic layer 166 can be sandwiched by a hole injection layer and an electron injection layer. In addition to the hole injection layer and the electron injection layer, a hole transport layer, an electron transport layer, a hole blocking layer and an electron blocking layer may be appropriately added to the organic layer 166.

The present embodiment exemplifies what is called a top-emission type in which the light emitting element 140 outputs light emitted by the organic layer 166 to the opposing electrode 168 side. However, the present embodiment is not limited thereto and a bottom-emission type in which light emitted by the organic layer 166 is output to the pixel electrode 164 side can also be applied. When the organic layer 166 is stacked with a hole injection layer, a light emitting layer and an electron injection layer in this order, it is preferable to use ITO (Indium Tin Oxide) or IZO (Indium Zinc Oxide) which have excellent hole injecting properties for the pixel electrode 164. ITO is a translucent conductive material and while it has a high transparency to light in the visible light band, it also has extremely low reflectivity. In order to add a function for reflecting light to the pixel electrode 164, it is preferable to stack metal layers such as aluminum (Al) or silver (Ag) and the like. Alternatively, as is shown in FIG. 4, a third insulation layer 162 and a second capacitor electrode 160 may be arranged below the pixel electrode 164. The third insulation layer 162 and the second capacitor electrode 160 are formed by ITO and the like to form the second capacitor element 144. And the second capacitor electrode 160 may include a metal material so as to also function as a reflective plate.

In order to allow light emitted by the organic layer 166 to pass through, the opposing electrode 168 is preferable to be formed by a transparent conductive film such as ITO (Indium Tin Oxide) or IZO (Indium Zinc Oxide) and the like which have translucency and conductivity.

The sealing layer 172 is arranged above the light emitting element 140. The sealing layer 172 covers the entire surface of the light emitting element 140 and is arranged to prevent the infiltration of water and the like. A material having translucency is preferable to be used as the sealing layer 172 such as silicon nitride or aluminum oxide. In addition, filler may also be arranged between the second substrate 104 and sealing layer 172. In addition, a part of the sealing layer 172 may also include an organic layer. For example, a stacked structure of an inorganic layer/organic layer/inorganic layer is also possible.

The second substrate 104 may be arranged a light blocking layer 182 and color filter layer 184. The color filter layer 184 is arranged at a position opposing each of the plurality of pixels 122. The light blocking layer 182 is arranged at a position which demarcates each of the plurality of pixels 122. When white color light is emitted from the light emitting element 140, the display device 100 can display color image by arranging the color filter layer 184.

Not shown in the diagram, optical films such as a polarization film and a retardation film and the like may also be arranged on the second substrate 104. An optical film is arranged to cover the plurality of pixels 122 on an outer side surface of the second substrate 104. An optical film is arranged in order to suppress degradation in visibility due to light incident to the display device 100 being reflected by the pixel electrode 164.

The structure of the display device 100 related to the present embodiment was explained above. The display device 100 related to the present embodiment includes the concave-convex structure in the inclined part of the bank layer 170, the organic layer 166, the opposing electrode 168 and the sealing layer 172. Among the light emitted by the organic layer 166 of the display device 100, light passes within each layer while being totally reflected. And the light is diffused by the concave-convex structure of the inclined part in each layer. In this way, reflected light whose incident angle is smaller than a critical angle increases and it is able to efficiently improve light extraction to the front direction in an inclined part.

<Method of Manufacturing a Display Device>

A method of manufacturing the display device 100 related to the present embodiment is explained while referring to FIG. 6A to FIG. 6F. FIG. 6A to FIG. 6F are cross-sectional diagrams showing a method of manufacturing the display device 100 related to the present embodiment. In the present embodiment, apart from the formation method of the bank layer 170, since an existing method can be used, such an explanation is omitted and a method for forming the bank layer 170 to the sealing layer 172 in the pixel region 106 is explained in detail in FIG. 6A to FIG. 6F.

Figure 6A:
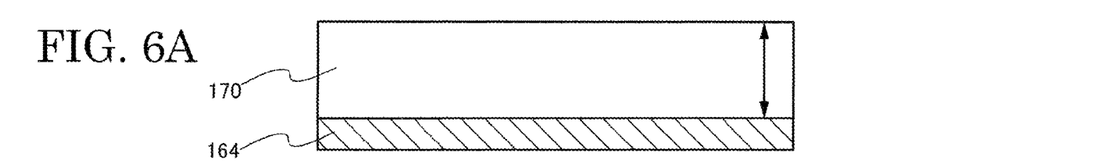
FIGS. 6A, 6B, 6C, 6D, 6E, and 6F are cross-sectional diagrams showing a method of manufacturing a display device related to one embodiment of the present invention.

As is shown in FIG. 6A, first the bank layer 170 is formed on an upper surface of the pixel electrode 164. In the present embodiment, a photosensitive polyimide resin is coated on roughly the entire surface of the pixel region 106 using an inkjet method. Although not shown in the diagram, prebaking is also performed in order to remove a solvent from the coated resin.

Figure 6B:
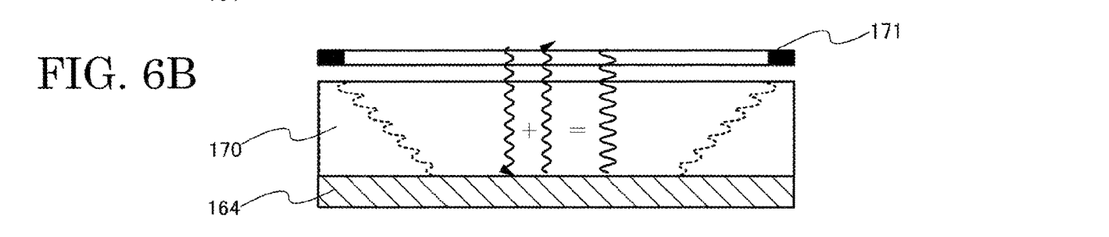

The bank layer 170 is formed by a photolithography method. As is shown in FIG. 6B, a mask 171 is arranged above the bank layer 170 and exposure is performed via an opening part of the mask 171. The opening part of the mask 171 is arranged to be positioned above the pixel electrode 164. In other words, an unopen part is arranged to cover at least an end part of the pixel electrode 164. That is, an opening end part of the mask 171 is arranged to be positioned on the inner side of the pixel electrode 164. It is possible to use monochromatic light having a wavelength in the range of 300 nm to 500 nm such as an i beam ($\lambda$=365 nm), h beam ($\lambda$=405 nm) and g beam ($\lambda$=436 nm) for example as the exposure light. By exposing the bank layer 170 above the pixel electrode 164 with monochromatic light, a standing wave is produced by interference between an incident wave and a reflected wave from the pixel electrode 164 (reflection surface). By the influence of the standing wave, the exposure level of the bank layer 170 changes in the irradiation direction of the exposure light (film thickness direction). A change (weakening and strengthening) in the exposure level is cyclical in a film thickness direction and is formed at a ½ cycle ($\lambda$/2) of the light source wavelength. Here, the exposure level indicates the amount by which the bank layer 170 is exposed.

In a general photolithography method, PEB (post exposure bake) after an appropriate amount of exposure time is performed in order to remove the standing wave effects. However, in the present embodiment, in order to form a concave-convex structure using standing wave effects, baking is either performed at a temperature at which the concave-convex structure is preserved on the inclined surface of the bank layer or may be omitted.

Figure 6C:
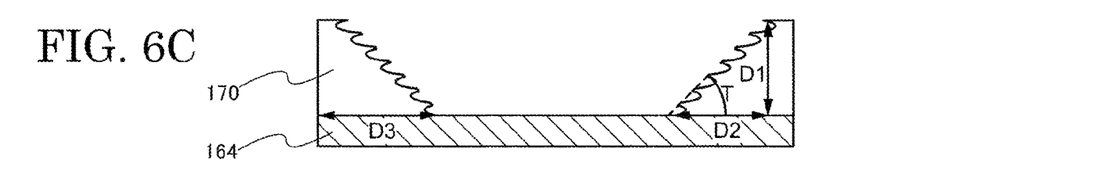

The bank layer 170 is developed as is shown in FIG. 6C. The bank layer 170 is formed as a taper structure having an inclined part according to the resolution of the exposure apparatus. An angle (taper angle, T) formed between the inclined part and bottom part of the bank layer 170 is 45° or more. That is, when a film thickness of the bank layer 170 is given as D1 and the width of the inclined part of the bank layer 170 in a plane direction is given as D2, D2 is preferred to be smaller than D1. The inclined part of the bank layer 170 is formed above the pixel electrode 164. In other words, an upper surface end part of the bank layer 170 is formed further to the inner side than at least an end part of the pixel electrode 164 see in a planar view. That is, when a film thickness of the bank layer 170 is given as D1 and the width from the opening in the bank (inclined bottom end part of the bank layer 170) to the end part of the pixel electrode 164 is given as D3, D3 is preferred to be bigger than D1.

The exposure level of the bank layer 170 changes in the irradiation direction of the exposure light (film thickness direction) due to the standing wave produced in FIG. 6B. As is shown in FIG. 6C, a change in the exposure level forms a concave-convex structure in an opening inclined surface part by performing development. In other words, exposure by a standing wave produces a change in the exposure level, and a concave-convex structure is formed on the surface of the inclined part of the bank layer 170 by performing development. The concave-convex structure in the inclined part reflects the waveform of the standing wave. As a result, the concave-convex structure in the inclined part is cyclical in an irradiation direction of the exposure light (film thickness direction) and is formed at a ½ cycle ($\lambda/2$) of the light source wavelength. That is, a concave-convex structure in the inclined part with a cycle of about 180 nm can be formed when an i beam ($\lambda$=365 nm) is used as the exposure light. A concave-convex structure with a cycle of about 200 nm can be formed when a h beam ($\lambda$=405 nm) is used as the exposure light, and a concave-convex structure with a cycle of about 220 nm can be formed when a g beam ($\lambda$=436 nm) is used as the exposure light. In this way, a cycle in the film thickness direction of the concave-convex structure can be controlled by the wavelength of the exposure light.

Although not shown in the diagram, post-baking of the bank layer 170 formed in FIG. 6C is performed in order to stabilize the concave-convex structure of the inclined part and improve resistance of the bank layer 170. Suitable conditions of the post-baking process are those which can remove any residual solvent or developer in a resin and which can maintain and stabilize the concave-convex structure of the inclined part. For example, when an acrylic resin is used as the bank layer 170, post-baking may be performed at 100° C. or less for 0.5 hours in a provisional baking process and at 200° C. to 300° C. for 0.5 to 1 hour in a main baking process. Here, the temperature in a provisional baking process is preferred to be lower than a glass transition point. By performing a provisional baking process at a temperature lower than a glass transition point, it is able to maintain the concave-convex structure of the inclined part of the bank layer 170 and improve resistance of the bank layer 170.

Figure 6D:
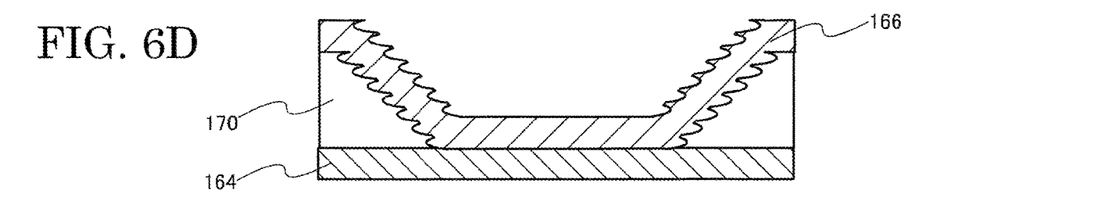

Next, the organic layer 166 is formed. The organic layer 166 is formed to cover an opening part in the upper surface of the bank layer 170. That is, the organic layer 166 is formed in each pixel on the upper surface of the pixel electrode 164 and the bank layer 170. As is shown in FIG. 6D, the organic layer 166 forms a concave-convex structure along the concave-convex structure of the inclined part of the bank layer 170 in an opening inclined surface part. In other words, the organic layer 166 forms a concave-convex structure above an inclined part of the bank layer 170. However, the present embodiment is not limited to this and at least a part of the concave-convex structure of the organic layer 166 may be buried.

Figure 6E:
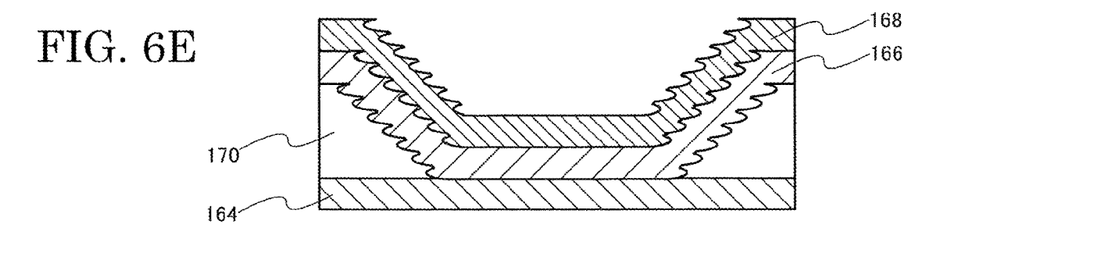

Next, the opposing electrode 168 is formed. The opposing electrode 168 is arranged to cover an upper surface of the bank layer 170 from an upper surface of the organic layer 166 and is formed as a common electrode bridging a plurality of pixels 122. As is shown in FIG. 6E, the opposing electrode 168 forms a concave-convex structure along the concave-convex structure of the inclined part of the bank layer 170 and the organic layer 166 in an opening inclined surface part. In other words, the opposing electrode 168 forms a concave-convex structure above an inclined part of the bank layer 170. However, the present embodiment is not limited to this and at least a part of the concave-convex structure of the opposing electrode 168 may be buried.

Figure 6F:
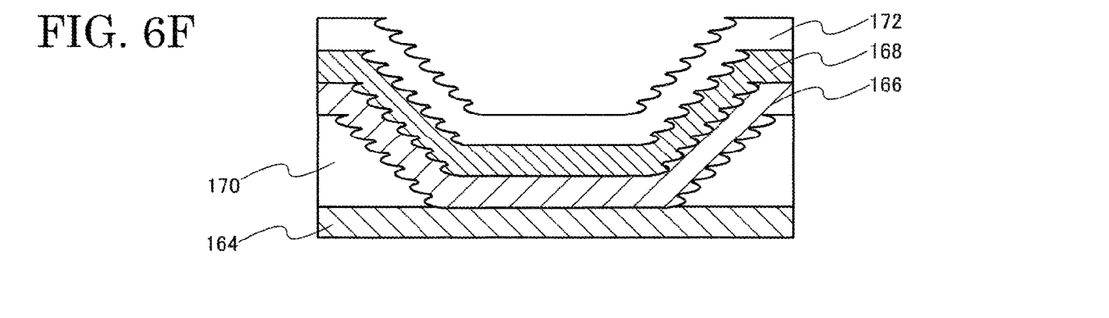

Next, the sealing layer 172 is formed. The sealing layer 172 is formed on roughly the entire surface of the pixel region 106. As is shown in FIG. 6F, the sealing layer 172 forms a concave-convex structure along the concave-convex structure of the inclined part of the bank layer 170, organic layer 166 and opposing electrode 168 in an opening inclined surface part. In other words, the sealing layer 172 forms a concave-convex structure above an inclined part of the bank layer 170. However, the present embodiment is not limited to this and at least a part of the concave-convex structure of the sealing layer 172 may be buried.

A method of manufacturing the display device 100 related to the present embodiment was explained above. It is able to form the display device 100 having a concave-convex structure in an inclined part of the bank layer 170, organic layer 166, opposing electrode 168 and sealing layer 172 using the method of manufacturing the display device 100 related to the present embodiment. By adopting such a structure, among the light emitted by the organic layer 166 of the display device 100, light which is passed within each layer while repeatedly being totally reflected causes irregular reflection due to the concave-convex structure of the inclined part in each layer. In this way, reflected light whose incident angle is smaller than a critical angle increases, and it is able to improve the extraction efficiency of light in a front direction in an inclined part.

<Light Path in a Display Device>

Figure 7A:
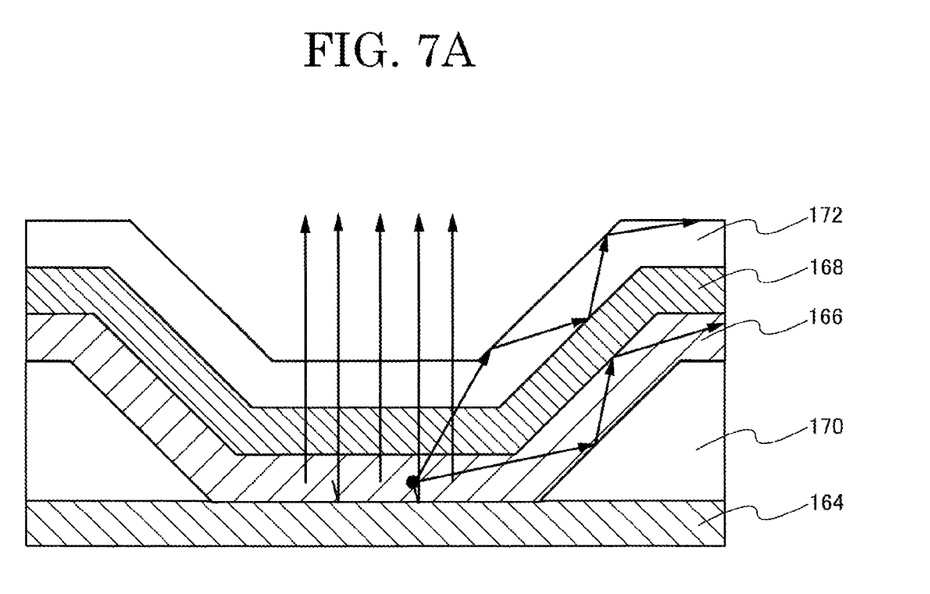
FIG. 7A is a cross-sectional diagram showing a path of light in a conventional display device.
Figure 7B:
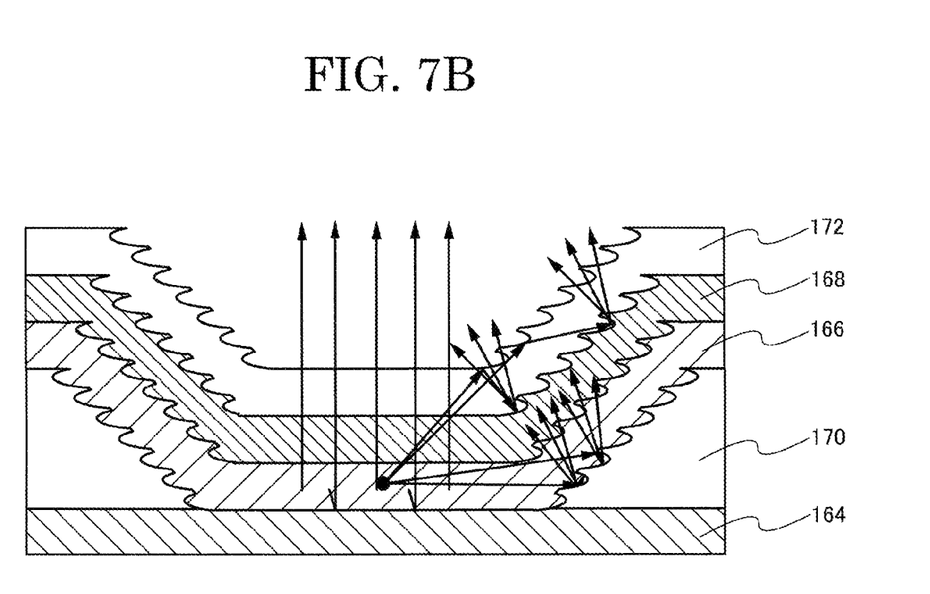
FIG. 7B is a cross-sectional diagram showing a path of light in a display device related to one embodiment of the present invention.

The light extraction principle of the display device 100 related to the present embodiment is explained while referring to FIG. 7A and FIG. 7B. FIG. 7A is a cross-sectional diagram showing a path of light in a conventional display device 100. FIG. 7B is a cross-sectional diagram showing a path of light in the display device 100 related to the present embodiment.

In both of the display devices in FIG. 7A and FIG. 7B, light heading towards the front surface of the display device among the light emitted by the organic layer 166 resonates (cavitatates) between the pixel electrode 164 (or the second capacitor electrode 160), having a function of a reflective plate, and the opposing electrode 168 which is a transparent conductive film, thereby light extraction efficiency is improved. As a result, it is necessary that the pixel electrode 164 (or the second capacitor electrode 160), the organic layer 166, the opposing electrode 168 and the sealing layer 172 are all flat at an opening in the bank layer 170 where the organic layer 166 is directly sandwiched between the pixel electrode 164 and the opposing electrode 168.

As is shown in FIG. 7A, the majority of light emitted by an organic layer 166 in a conventional display device passes within each layer with repeatedly being totally reflected because of differences in interlayer refractive indexes. The light which is passed within each layer is not extracted from a front surface of the display device 100 but is attenuated and absorbed within a layer.

On the other hand, as is shown in FIG. 7B, light which is passed within each layer in the display device related to the present embodiment presently causes irregular reflection by the concave-convex structure in the inclined part of each layer. In this way, reflected light whose incident angle is smaller than a critical angle increases, and more light is extracted from the front surface of the display device. That is, it is able to further improve the extraction efficiency of light from the front surface of a display device by the concave-convex structure in the inclined part of each layer. In the present embodiment, by providing each of the bank layer 170, the organic layer 166, the opposing electrode 168, and the sealing layer 172 with a concave-convex structure, it is able to extract the light passed within each layer respectively. However, the present embodiment is not limited to this and it is sufficient that at least part of these layers includes a concave-convex structure.

Not shown in the diagram, optical films such as a polarization film and a retardation film and the like may be arranged on the second substrate 104 in order to suppress reflection of external light at the display device. The upper surface part of the bank layer 170 is preferable to be flat so as not to decrease reflective light-cutting effect by the optical films.

The light extraction principle of the display device 100 related to the present embodiment was explained above. The display device 100 related to the present embodiment includes a concave-convex structure in an inclined part of the bank layer 170, organic layer 166, opposing electrode 168 and sealing layer 172. By adopting such a structure, among the light emitted by the organic layer 166 of the display device 100, light passed within each layer while repeatedly being totally reflected causes irregular reflection by the concave-convex structure of the inclined part in each layer. In this way, reflected light whose incident angle is smaller than a critical angle increases, and it is able to improve light extraction efficiency to the front direction in an inclined part.

What is claimed is:

1. A display device comprising:
   a first electrode arranged in a matrix shape above an insulation surface;
   a bank covering an end part of the first electrode and having an opening part exposing an upper surface of the first electrode;
   an organic layer covering the opening part and including a light emitting layer; and
   a second electrode covering the bank and the organic layer, wherein
   the bank has an upper surface part and an inclined part between the upper surface part and the opening in the bank,
   a surface of the inclined part has a plurality of concave and convex parts, each of the plurality of concave and convex parts are ring shaped by surrounding the opening part in a planar view,
   a cycle of the plurality of concave and convex parts is in a range of 150 nm to 250 nm, and
   the plurality of concave and convex parts and the bank consist of same material.

2. The display device according to claim 1, wherein the plurality of concave and convex parts have a cyclical banded shape in a film thickness direction.

3. The display device according to claim 1, wherein the bank is a photosensitive organic resin material.

4. The display device according to claim 1, wherein a film thickness of the bank is set as D1 and a width of the inclined part of the bank in a plane direction is set as D2, D2 is smaller than D1.

5. The display device according to claim 4, wherein an end part of the first electrode is further to the outer side than the inclined part seen in a planar view.

6. The display device according to claim 1, wherein the upper surface part is flat.

7. The display device according to claim 1, wherein the organic layer has the plurality of concave and convex parts above the inclined part.

8. The display device according to claim 7, wherein a second electrode has the plurality of concave and convex parts above the inclined part.

* * * * *